(12) United States Patent
Ichinose (10) Patent No.: US 7,701,210 B2
(45) Date of Patent: Apr. 20, 2010

(54) MRI APPARATUS, METHOD AND PROCESS GENERATING DIFFUSION WEIGHTED IMAGES USING APPARENT DIFFUSION COEFFICIENTS AND THRESHOLD VALUES

(75) Inventor: Nobuyasu Ichinose, Otawara (JP)

(73) Assignees: Kabushiki Kaisha Toshiba, Tokyo (JP); Toshiba Medical Systems Corporation, Tochigi (JP)

( * ) Notice: Subject to any disclaimer, the term of this patent is extended or adjusted under 35 U.S.C. 154(b) by 110 days.

(21) Appl. No.: 11/822,342

(22) Filed: Jul. 5, 2007

(65) Prior Publication Data

US 2008/0007264 A1 Jan. 10, 2008

(30) Foreign Application Priority Data

Jul. 7, 2006 (JP) .............................. 2006-188284

(51) Int. Cl.
G01V 3/00 (2006.01)
(52) U.S. Cl. ...................................... 324/309; 324/307
(58) Field of Classification Search ......... 324/300–322; 128/204.18, 205.22; 382/171, 128–131; 600/481; 702/181
See application file for complete search history.

(56) References Cited

U.S. PATENT DOCUMENTS

| 5,560,360 | A  | * | 10/1996 | Filler et al. ................. 600/408 |
| 7,020,578 | B2 | * | 3/2006  | Sorensen et al. ............. 702/181 |
| 2004/0127799 | A1 |   | 7/2004 | Sorensen et al. ............. 600/481 |
| 2006/0201504 | A1 | * | 9/2006 | Singhal et al. ......... 128/204.18 |
| 2007/0019861 | A1 | * | 1/2007 | Zwanger ..................... 382/171 |
| 2008/0007264 | A1 | * | 1/2008 | Ichinose ..................... 324/318 |
| 2008/0069417 | A1 | * | 3/2008 | Kimura ....................... 382/131 |
| 2009/0034812 | A1 | * | 2/2009 | Nowinski et al. ........... 382/131 |

FOREIGN PATENT DOCUMENTS

| JP | 6-54830 | 3/1994 |
| JP | 2006-247113 | 9/2006 |
| WO | 2007/058632 A1 | 5/2007 |

OTHER PUBLICATIONS

Nishimura et al., "diffusion-perfusion MRI Ichibousenri" Medical Review Co., p. 32 (2006).
Bihan et al., "Intravoxel Incoherent Motion Imaging Using Spin Echoes", Magnetic Resonance in Medicine, vol. 19, No. 2, pp. 221-227 (1991).
Burdette et al., "Acute Cerebral Infarction: Quantification of Spin-Density and T2 Shine-through Phenomena on Diffusion-weighted MR Images", Radiology, vol. 212, Radiology, pp. 333-339 (1999).

(Continued)

Primary Examiner—Brij B. Shrivastav
Assistant Examiner—Tiffany A Fetzner
(74) Attorney, Agent, or Firm—Nixon & Vanderhye PC (57) ABSTRACT

A magnetic resonance imaging apparatus includes a unit which generates a diffusion weighted image based on a magnetic resonance signal from an object, a unit which calculates an apparent diffusion coefficient based on the diffusion weighted image, and a processing unit which subjects the diffusion weighted image to a process of indicating a region having the apparent diffusion coefficient of less than a threshold value with a highlight in contrast with other region.

10 Claims, 7 Drawing Sheets

OTHER PUBLICATIONS

Takahara et al., "Diffusion Weighted Whole Body Imaging with Background Body Signal Suppression (DWIBS): Technical Improvement Using Free Breathing, STIR and High Resolution 3D Display", Radiation Medicine, vol. 22, No. 4, pp. 275-282 (2004).

Extended European Search Report mailed Nov. 11, 2008 in Patent Application EP 07 01 3026.5.

Bernarding J. et al., "Histogram-Based Characterization of Healthy and Ischemic Brain Tissues Using Multiparametric MR Imaging Including Apparent Diffusion Coefficient Maps and Relaxometry," Magnetic Resonance in Medicine, Academic Press, Duluth, MN, US, vol. 43, No. 1, Jan. 1, 2000, pp. 52-61, XP007906072, ISSN: 0740-3194.

Kidwell C. S. et al., "Diffusion MRI in Patients With Transient Ischemic Attacks," Stroke, Lippincott Williams & Wilkins, US, vol. 30, No. 6, Jun. 1, 1999, pp. 1174-1180, XP007906073, ISSN 0039-2499.

* cited by examiner

MRI APPARATUS, METHOD AND PROCESS GENERATING DIFFUSION WEIGHTED IMAGES USING APPARENT DIFFUSION COEFFICIENTS AND THRESHOLD VALUES

CROSS-REFERENCE TO RELATED APPLICATIONS

This application is based upon and claims the benefit of priority from prior Japanese Patent Application No. 2006-188284, filed Jul. 7, 2006, the entire contents of which are incorporated herein by reference.

BACKGROUND OF THE INVENTION

1. Field of the Invention

The present invention relates to a magnetic resonance imaging apparatus and a magnetic resonance imaging method that can form a diffusion weighted image (to be called as DWI image hereinafter) and an apparent diffusion coefficient image (to be called as ADC image) obtained by diffusion weighted imaging, and an image processing apparatus that handles DWI images and ADC images.

2. Description of the Related Art

The magnetic resonance imaging is an imaging method in which nuclear spin of an object placed in a static magnetic field is magnetically exited with a high-frequency signal of its Larmor frequency, and an image is reconstructed from an MR signal generated along with the excitation.

The diffusion weighted imaging method is one of the imaging methods in the field of the magnetic resonance imaging, and DWI images that shows the diffusing manner (speed, direction, etc.) of water molecules in tissue. The DWI imaging is used to identify a tumor in, for example, the trunk of body and it has such an advantage of a high sensitivity and a high contrast as compared to those of the other imaging methods. This diffusion weighted imaging method has been made popular by the following publications, "Le Bihan D, MRM 19(2):221-227 (1991)", "Takahara T, Radiat Med 22(4):275-282 (2004)" and "Tsunehiko Nishimura et al., diffusion•perfusion MRI (Ichibousennri (unlimited expansion of view):32, Medical View Co. 2006". The last publication discloses DWI (Diffusion Weighted Imaging), especially "T2 shine-through".

However, there is a tendency with the DWI imaging that a tissue with a large T2 value is extracted at a high signal even though it is not a tumor (which is the so-called "T2 shine-through"). (See "Burdette J H, Radiology 212:333-339 (1999)".) Under these circumstances, some special attention must be paid when visually analyzing a DWI image. On the other hand, when a DWI image is subjected to an MIP (maximum intensity projection) process, a tumor, in some case, is hidden behind some normal tissue of a high intensity signal. Further, although it is possible to a certain extent to distinguish a tumor from a normal tissue of a high intensity signal by measuring the ADC value with an ADC image formed from DWI images having different b factors from each other, such an observation based solely on the ADC value is not sufficient since the ADC value is an apparent diffusion coefficient, which is naturally not absolute one. Further, solely with the ADC image, it is difficult to make a judgment on the form of tissue itself. Furthermore, DWI and ADC are separate images, and therefore it is laborious to visually observe them for comparison and contrast.

As described above, it is conventionally difficult to read an image accurately with each individual image regardless of whether it is a DWI image or ADC image.

A more accurate reading of image can be achieved by comparing the DWI image and ADC image; however it is conventionally laborious to compare and contrast them since they are separate images.

BRIEF SUMMARY OF THE INVENTION

Under these circumstances, there has been a demand of an aid to achieve a more accurate reading of images.

According to a first aspect of the present invention, there is provided a magnetic resonance imaging apparatus comprising: a unit which generates a diffusion weighted image based on a magnetic resonance signal from an object; a unit which calculates an apparent diffusion coefficient based on the diffusion weighted image; and a processing unit which subjects the diffusion weighted image to a process of indicating a region having the apparent diffusion coefficient of less than a threshold value with a highlight in contrast with other region.

According to a second aspect of the present invention, there is provided an image processing apparatus comprising: a first memory unit which stores a diffusion weighted image of an object; a second memory unit which stores an apparent diffusion coefficient image related to the diffusion weighted image; and a processing unit which subjects the diffusion weighted image to a process of indicating a region having an apparent diffusion coefficient of less than a threshold value with a highlight in contrast with other region of the apparent diffusion coefficient image.

According to a third aspect of the present invention, there is provided a magnetic resonance imaging method comprising the steps of: generating a diffusion weighted image based on a magnetic resonance signal from an object; calculating an apparent diffusion coefficient based on the diffusion weighted image; and subjecting the diffusion weighted image to a process of indicating a region having the apparent diffusion coefficient of less than a threshold value with a highlight in contrast with other region.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Embodiments of the present invention will now be described with reference to accompanying drawings.

Figure 1:
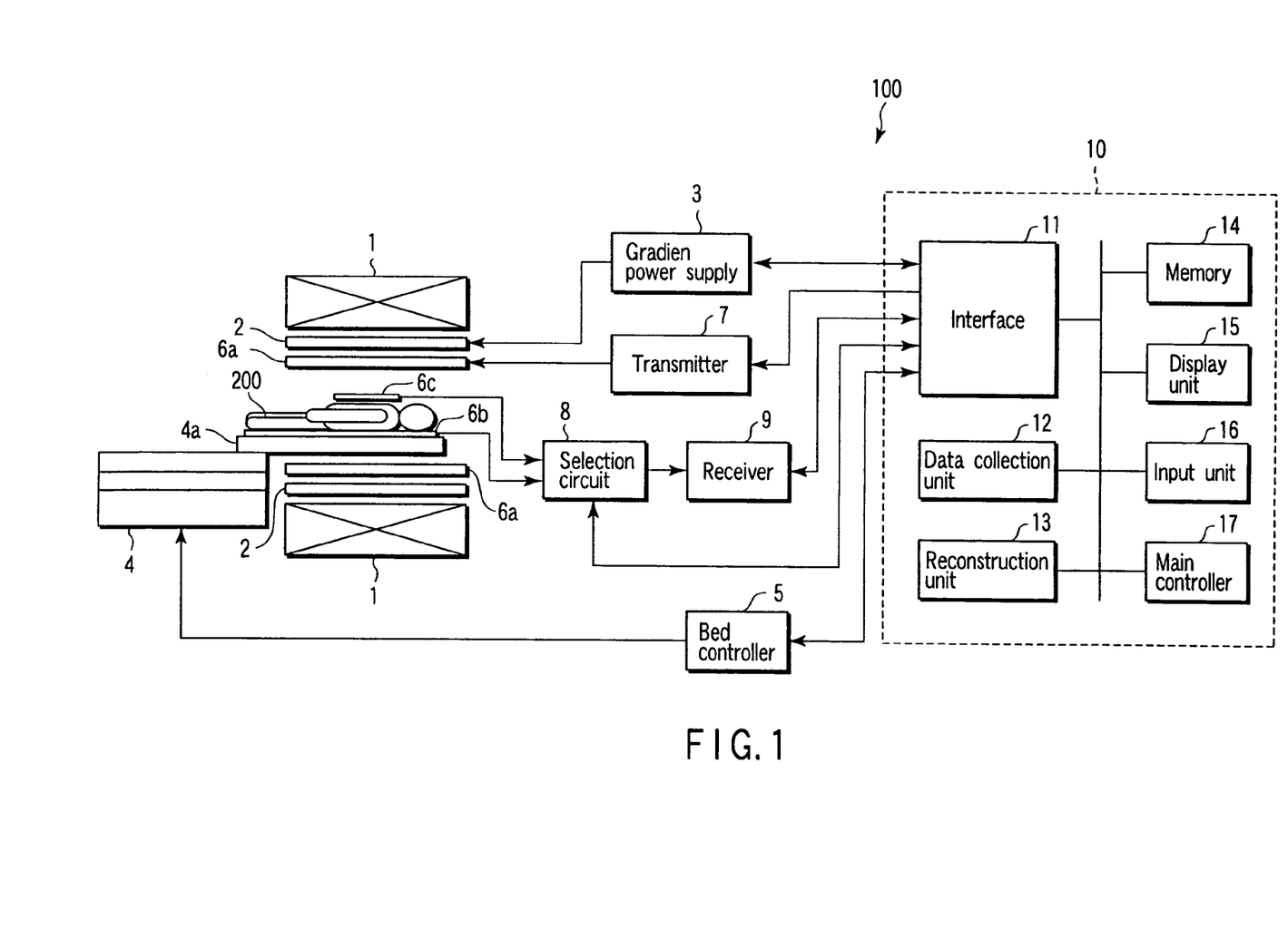
FIG. 1 is a diagram showing the structure of a magnetic resonance imaging apparatus (MRI apparatus) according to an embodiment of the present invention.

FIG. 1 is a diagram showing the structure of a magnetic resonance imaging apparatus (MRI apparatus) 100 according to an embodiment. The MRI apparatus 100 includes a static field magnet 1, a gradient coil 2, a gradient power supply 3, a bed 4, a bed controller 5, RF coil units 6a, 6b and 6c, a transmitter 7, a selection circuit 8, a receiver 9 and a computer system 10.

The static field magnet 1 is a hollow cylindrical member and generates a uniform static magnetic filed within its inner space. The static field magnet 1 is, for example, a permanent magnet or superconducting magnet.

The gradient coil 2 is a hollow cylindrical member and placed inside the static field magnet 1. The gradient coil 2 is a combination of three types of coils corresponding respectively to X, Y and Z axes crossing normally with each other. In the gradient coil 2, the three coils are individually supplied with a current from the gradient power supply 3, thereby generating gradient magnetic fields having their magnetic field intensities varied along the X, Y and Z axes. Assume here that the Z-axis direction corresponds to, for example, the magnetization direction of the static field. The gradient magnetic fields along the X, Y and Z axes correspond to, for example, a slice-selecting gradient magnetic field Gs, a phase-encoding gradient magnetic field Ge and a readout gradient magnetic field Gr, respectively. The slice-selecting gradient magnetic field Gs is used to determine an arbitrary imaging section. The phase-encoding gradient magnetic field Ge is used to change the phase of a magnetic resonance signal in accordance with its spatial position. The readout gradient magnetic field Gr is used to change the frequency of a magnetic resonance signal in accordance with its spatial position.

A patient P while placed on the top board 4a of the bed 4 is inserted into the cavity (imaging space) of the gradient coil 2 along with the bed 4. The top board 4a of the bed 4 is longitudinally and vertically driven by the bed controller 5. Normally, the bed 4 is positioned with its longitudinal direction set parallel to the central axis of the static field magnet 1.

The RF coil unit 6a has such a structure that one or more coils are housed in a cylindrical case. The RF coil unit 6a is located inside the gradient coil 2. The RF coil unit 6a generates a high-frequency magnetic field upon receiving a high-frequency pulse (RF pulse) signal from the transmitter 7.

The RF coil units 6b and 6c are placed on or built in the top board 4a, or mounted on the patient P. For imaging, they are inserted together with the patient P to the imaging space of the gradient coil 2. The RF coil units 6b and 6c are array coils. In other words, the RF coil units 6b and 6c each include a plurality of element coils. Each of the element coils of each of the RF coils 6b and 6c receives a magnetic resonance signal radiated from the patient P. Output signals of the element coils are separately input to the selection circuit 8. The receiver-use RE coil units are not limited to the RF coil units 6b and 6c, but various types of coil units may be used arbitrary. The number of receiver-use RF coil units may be 1 or 3 or more.

The transmitter 7 transmits, to the RF coil unit 6a, an RF pulse signal corresponding to the Larmor frequency.

The selection circuit 8 selects some of a great number of magnetic resonance signals outputted from the RF coil units 6b and 6c. Then, the selection circuit 8 supplies the selected magnetic resonance signals to the receiver 9. The computer system 10 instructs which channel to be selected.

The receiver 9 includes a plurality of channels of processing systems each containing an amplifier, a phase detector and an analog-digital converter. The magnetic resonance signals selected by the selection circuit 8 are inputted to these channels of processing systems, respectively. The amplifier amplifies a magnetic resonance signal. The phase detector detects the phase of a respective magnetic resonance signal outputted from the amplifier. The analog-digital converter converts a signal outputted from the phase detector into a digital signal. The receiver 9 generates digital signals obtained by the processing systems.

The computer system 10 includes an interface 11, a data collection unit 12, a reconstruction unit 13, a memory 14, a display unit 15, an input unit 16 and a main controller 17.

The interface 11 is connected to the gradient power supply 3, the bed controller 5, the transmitter 7, the receiver 9, the selection circuit 8, etc. The interface 11 inputs and outputs signals that are received and transmitted between these components connected thereto and the computer system 10.

The data collection unit 12 collects digital signals output from the receiver 9, and stores the collected digital signals, that is, magnetic resonance signal data, in the memory 14.

The reconstruction unit 13 performs post-processing, i.e., reconstruction processing such as Fourier transform, on the magnetic resonance signal data stored in the memory 14, thereby acquiring spectrum data or image data corresponding to a desired nuclear spin in the patient 200.

The memory 14 stores the magnetic resonance signal data and spectrum data or image data of each patient.

The display unit 15 displays various information items, such as spectrum data, image data, etc., under the control of the main controller 17. The display unit 15 may be formed of, for example, a display device such as a liquid crystal display.

The input unit 16 receives various instructions or information items input by an operator. The input unit 16 may be a pointing device such as a mouse or track ball, a selective device such as a mode switch, or an input device such as a keyboard.

The main controller 17 includes a CPU, memory, etc., not shown, and controls the entire MRI apparatus 100 of the embodiment. The controller 17 includes the function of generating an ADC image, a low-ADC range image (low range image), a diagnostic reading image and an MIP image.

The structure of the MRI apparatus has been described. The feature of the invention is in the image processing when DWI imaging is carried out. The imaging process will now be described in detail.

The First Embodiment

Figure 2:
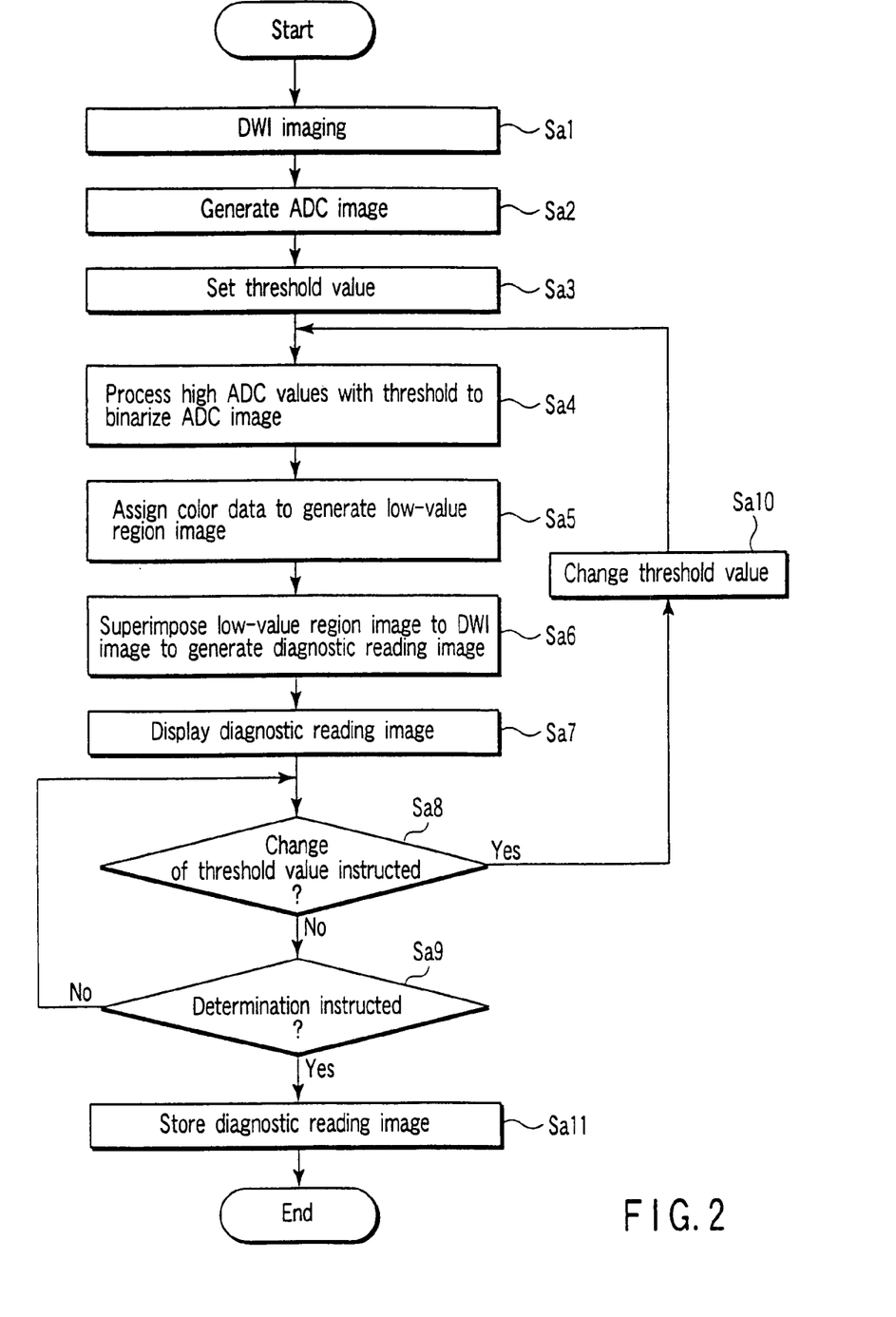
FIG. 2 is a flowchart illustrating the steps of the process of the control section shown in FIG. 1 in a first embodiment.

FIG. 2 is a flowchart illustrating the processing steps of the main controller 17 in the first embodiment.

When there rises a necessity of performing a diagnosis using the DWI method, the main controller 17 starts the process illustrated in FIG. 2.

Figure 3:
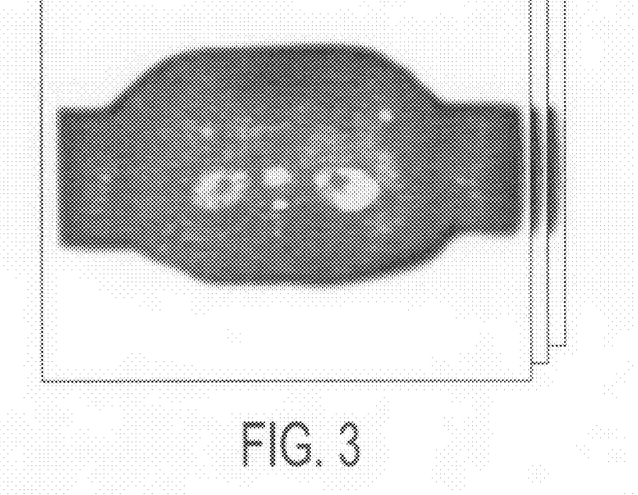
FIG. 3 is a diagram showing an example of the DWI image.

In step Sa1, the main controller 17 controls each member to carry out DWI imaging. The DWI imaging can be carried out by a conventionally known method, for example, the spin echo (SE) method, spin echo-type echo planner (SE-EPI) method or the like. In such a method, an MPG (motion probing gradient) pulse is added before and after a 180° sequence in its sequence, and thus the signal for molecules that are diffusing is reduced with respect to the signal for molecules that are not diffusing. In this manner, a range in which diffusion is occurring can be emphasized in contrast with a range where no diffusion is occurring. Thus, a plurality of slices of DWI images are formed by the reconstruction unit 13 during the DWI imaging. FIG. 3 is an example of the DWI images.

In step Sa2, the main controller 17 generates an ADC image for each of the DWI images. The ADC image can be generated by a conventionally known method. That is, from two DWI images obtained by arbitrary b factors different from each other ($b_1$, $b_2$), the diffusion coefficient for each pixel is calculated, and thus an ADC image is generated. The diffusion coefficient D can be obtained from an equation (2) which is based on an equation (1).

$$\ln(M/M_0) = -bD \qquad (1)$$

$$D = -[\ln(M/M_0)/b] = -[\ln(S/S_0)/b] \qquad (2).$$

If the signal intensities of the same pixel for the two DWI images taken with $b_1$ and $b_2$ are expressed as $S_1$ and $S_2$, respectively, these equations can be expressed as the following equations (3) and (4).

$$S_1/S_0 = \exp(-b_1 D) \qquad (3)$$

$$S_2/S_0 = \exp(-b_2 D) \qquad (4)$$

By taking a ratio between these equations (3) and (4), the following equation (5) is derived.

$$S_1/S_2 = \exp[-(b_1-b_2)D] \qquad (5)$$

Further, from the equation (5), the following equation (6) can be derived.

$$D = -[\ln(S_1/S_2)/(b_1-b_2)] \qquad (6)$$

Then, the ADC image is an image formed of pixels each having a diffusion coefficient D obtained based on the equation (6) as the respective pixel value.

Figure 4:
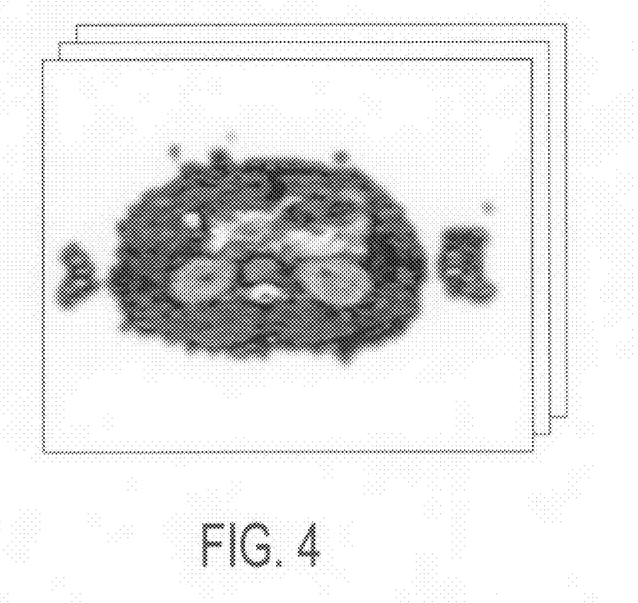
FIG. 4 is a diagram showing an example of the ADC image.

The diffusion coefficient D thus obtained is not exactly a genuine diffusion coefficient, but an apparent diffusion coefficient of each pixel in the DWI image. The pixel value of a pixel of an ADC image, which corresponds to a pixel without a significant information item in a DWI image (that is, for example, a pixel corresponding to a range outside the patient P) is set to "0". FIG. 4 is a diagram showing an example of the ADC image.

Figure 5:
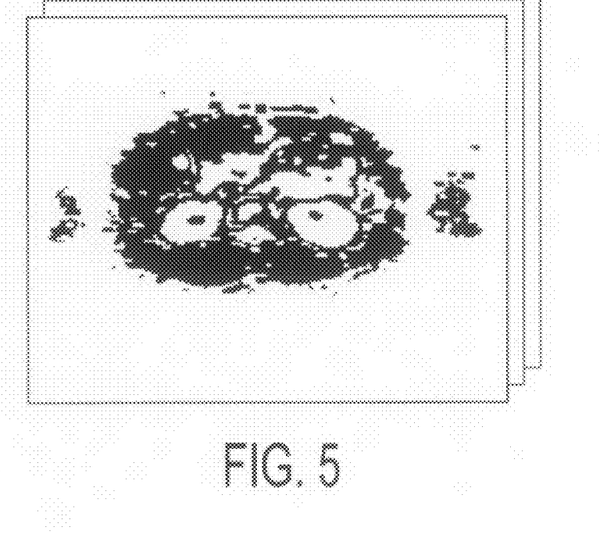
FIG. 5 is a diagram showing an example of a binary image in the first embodiment.

In step Sa3, the main controller 17 sets a threshold value. Here, the threshold value may be a value set by the operator, or a default value. In step Sa4, the main controller 17 processes a high ADC value with the threshold value to binarize the ADC image. More specifically, the main controller 17 substitutes "0" for those pixel values which are equal to or higher than the threshold value and "1" for those less than the threshold value, thereby binarizing the ADC image. In this example, the pixel value that is originally "0" is directly taken as "0". FIG. 5 is a diagram showing an example of the binary image thus obtained. It should be noted here that the pixel value that is originally "0" may be binarized simply without processing the originally 0 value directly as "0".

In step Sa5, the main controller 17 assigns color data such as "red" to a pixel having a pixel value of "1", thereby generating a low-range image. That is, the low-range image is an image having color data only in a range where the ADC value is less than the threshold value. In step Sa6, the main controller 17 superimposes the low-range image on the DWI image, thereby forming a diagnostic reading image. More specifically, it is assumed that each individual pixel having respective color data in a low-range image is a pixel having a color expressed by the color data and a pixel value corresponding to that in the DWI image, and each individual pixel having a pixel value of "0" in a low-range image is a black-and-white pixel having a pixel value corresponding to that in the DWI image. The main controller 17 carries out the steps Sa4 to Sa6 of the process on each of the slices obtained by the DWI imaging. In this manner, a plurality of images to be read are generated.

In step Sa7, the main controller 17 displays one or more of these images to be read that is selected by the operator on the display unit 15. In accordance with the instruction entered by the operator, the main controller 17 changes the image to be displayed. It is alternatively possible to display all of the images to be read in arrangement on the display unit 15.

While displaying the images to be read in the above-described manner, the main controller 17 stands by in step Sa8 or Sa9 whether the change of the threshold is assigned or the determination of a diagnostic reading image is assigned. While displaying the images as described above, the main controller 17 stands by in steps Sa8 and Sa9 for the designation of change of the threshold value or the determination of a diagnostic reading image. If the operator operates to designate the change of the threshold value through the input unit 16 while standing by, the main controller 17 proceeds with the process from step Sa8 to step Sa10.

In step Sa10, the main controller 17 changes the threshold value in accordance with the instruction entered by the operator. After that, the main controller 17 returns the processing step from step Sa10 to Sa4, and execute once again the steps from Sa4 on. That is, the main controller 17 re-generates images to be read using the changed threshold value.

If the operator instructs to determine the image to be read through the input unit 16 while standing by in step Sa8 or Sa9, the main controller 17 proceeds with the process from step Sa9 to step Sa11. In step Sa11, the main controller 17 stores the latest generated image in step Sa11. The location of the storage of the images to be read may be the memory 14, or an external image server. etc.

Figure 6:
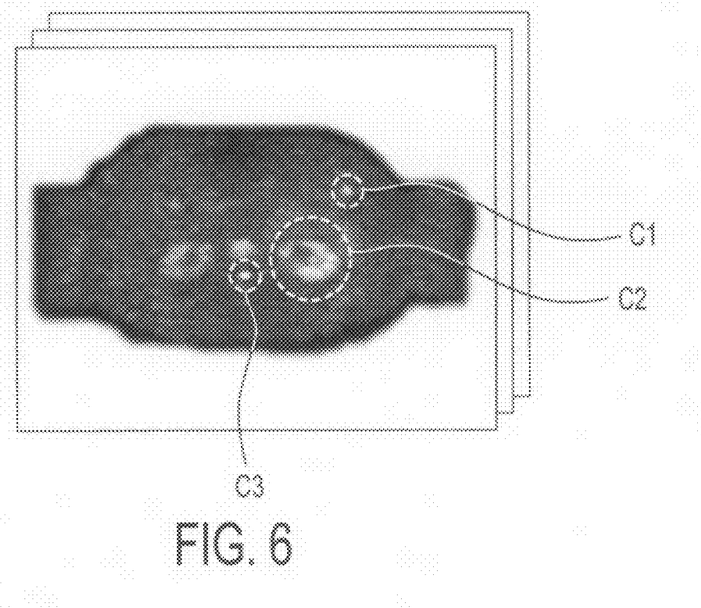
FIG. 6 is a diagram showing an example of a diagnostic reading image in the first embodiment.

FIG. 6 is a diagram showing an example of the image to be read. Although it is not clearly seen from the black-and-white image of FIG. 6, the region shown in FIG. 6 which corresponds to the white region of the binary image shown in FIG. 5 is colored, for example, in red. For example, the region of high pixel values that are present in a circle C1 is colored, whereas the regions of high pixel values that are present in circles C2 and C3 are not colored. The pixel value in the image shown in FIG. 6 corresponds to the DWI image, and whether or not a region is colored indicates whether or not the ADC value is less than the threshold value. A tumor has a high pixel value in a DWI image and a low ADC value, and therefore it is suspected that the region present in the circle 1, which has a high pixel value and is colored, is a tumor. By contrast, T2 shine-through has a high pixel value in a DWI image and further has a high ADC value as well, and therefore there is a possibility that the regions present in circles C2 and C3, which have high pixel values but are not colored, are T2 shine-through. As described, with the to-be-read images generated in the first embodiment, it is possible to read them while monitoring the data shown in DWI images and those shown in ADC images at the same time. In this manner, it is possible to assist the operator to be able to read images more accurately and more easily.

Further, according to the first embodiment, the threshold value can be arbitrarily set by the operator, and therefore even if the ADC value varies depending on an individual patient or imaging conditions, etc., the optimal threshold value can be set in accordance with the variation.

Furthermore, in the first embodiment, when the threshold value is changed, to-be-read images are automatically generated using the changed threshold value, and thus the displayed images are updated. In this manner, the operator is able to set an appropriate threshold value while monitoring the images to be read.

The Second Embodiment

Figure 7:
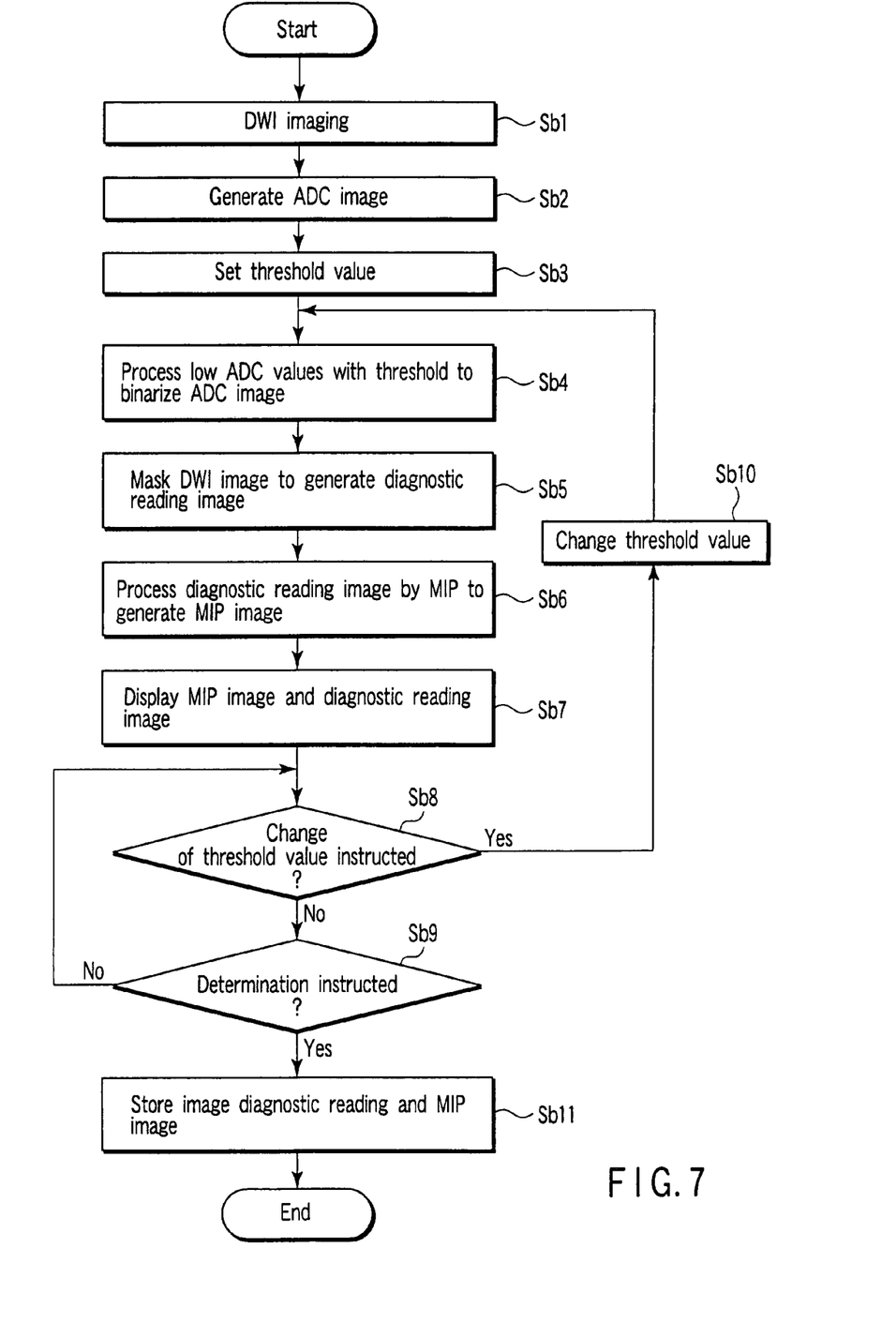
FIG. 7 is a flowchart illustrating the steps of the process of the control section shown in FIG. 1 in a second embodiment.

FIG. 7 is a flowchart illustrating the processing steps of the main controller 17 in the second embodiment.

When there rises a necessity of performing a diagnosis using the DWI method, the main controller 17 starts the process illustrated in FIG. 7.

In step Sb1, the main controller 17 controls each member to carry out DWI imaging. The DWI imaging can be carried out by a conventionally known method. In the DWI imaging, a plurality of slices of DWI images are formed by the reconstruction unit 13. In step Sb2, the main controller 17 generates an ADC image for each of the DWI images. The ADC image can be generated by a conventionally known method.

Figure 8:
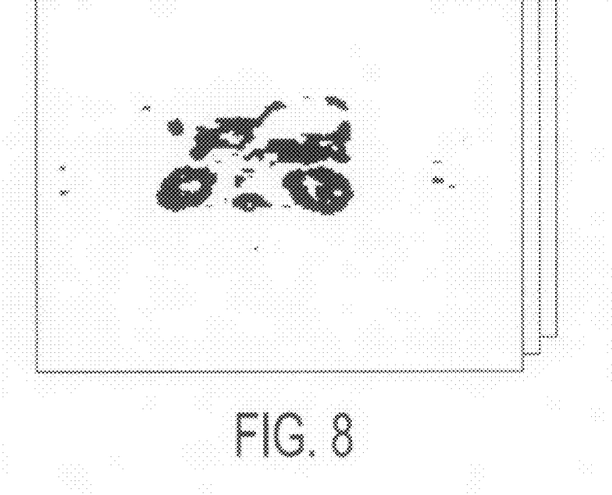
FIG. 8 is a diagram showing an example of a binary image in the second embodiment.

In step Sb3, the main controller 17 sets a threshold value. Here, the threshold value may be a value set by the operator, or a default value. In step Sb4, the main controller 17 processes a low ADC value with the threshold value to binarize the ADC image. More specifically, the main controller 17 substitutes "1" for those pixel values which are equal to or higher than the threshold value and "0" for those less than the threshold value, thereby binarizing the ADC image. FIG. 8 is a diagram showing an example of the binary image thus obtained.

Figure 9:
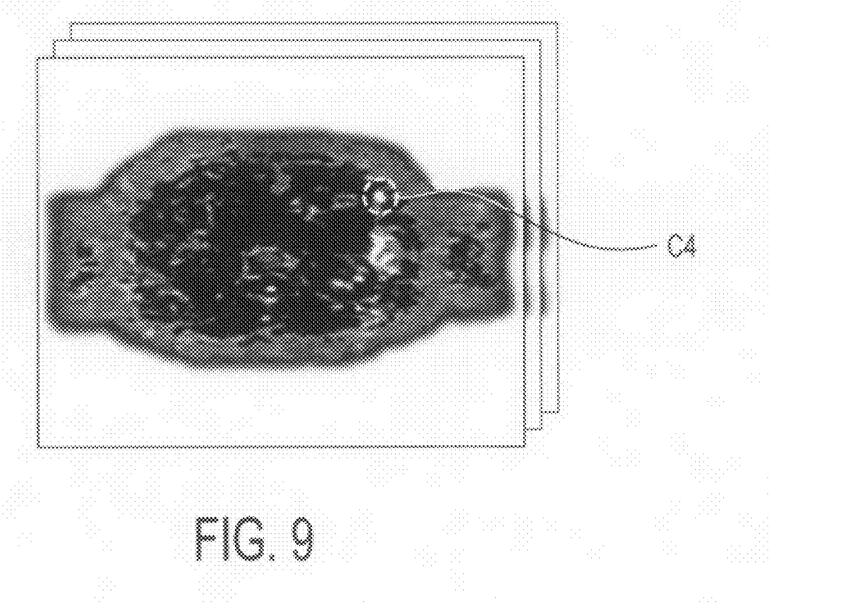
FIG. 9 is a diagram showing an example of a diagnostic reading image in the second embodiment.

In step Sb5, the main controller 17 subjects the DWI images to a masking process using the binary image obtained in step Sb4, thereby generating images to be read. More specifically, the pixel value of a pixel of a DWI image, which corresponds to a pixel having a value of "1" in the binary image, is replaced by "0". Further, the pixel value of a pixel of a DWI image, which corresponds to a pixel having a value of "0" in the binary image, is not changed. FIG. 9 is a diagram showing an example of the image to be read. The main controller 17 carries out the processes of steps Sb5 and Sb5 on each of the slices obtained by the DWI imaging. Therefore, a plurality of images to be read are generated. In step Sb6, the main controller 17 subjects these images to be read to the MIP process, thereby generating MIP images. FIG. 9 is a diagram showing an example of the MIP images.

In step Sb7, the main controller 17 displays one or more of the MIP images and the images to be read that is selected by the operator on the display unit 15. In accordance with the instruction entered by the operator, the main controller 17 changes the image to be displayed. It is alternatively possible to display all of the MIP images and the images to be read in arrangement on the display unit 15.

While displaying the MIP images and the images to be read in the above-described manner, the main controller 17 stands by in step Sb8 or Sb9 whether the change of the threshold is assigned or the determination of a diagnostic reading image is assigned. If the operator operates to designate the change of the threshold value through the input unit 16 while standing by, the main controller 17 proceeds with the process from step Sb8 to step Sb10.

In step Sb10, the main controller 17 changes the threshold value in accordance with the instruction entered by the operator. After that, the main controller 17 returns the processing step from step Sb10 to Sb4, and execute once again the steps from Sb4 on. That is, the main controller 17 re-generates images to be read and MIP images using the changed threshold value.

If the operator instructs to determine the image to be read through the input unit 16 while standing by in step Sb8 or Sb9, the main controller 17 proceeds with the process from step Sb9 to step Sb11. In step Sb11, the main controller 17 stores the latest generated to-be-read image and MIP image. The location of the storage of the image to be read and MIP image may be the memory 14, or an external image server, etc.

Figure 10:
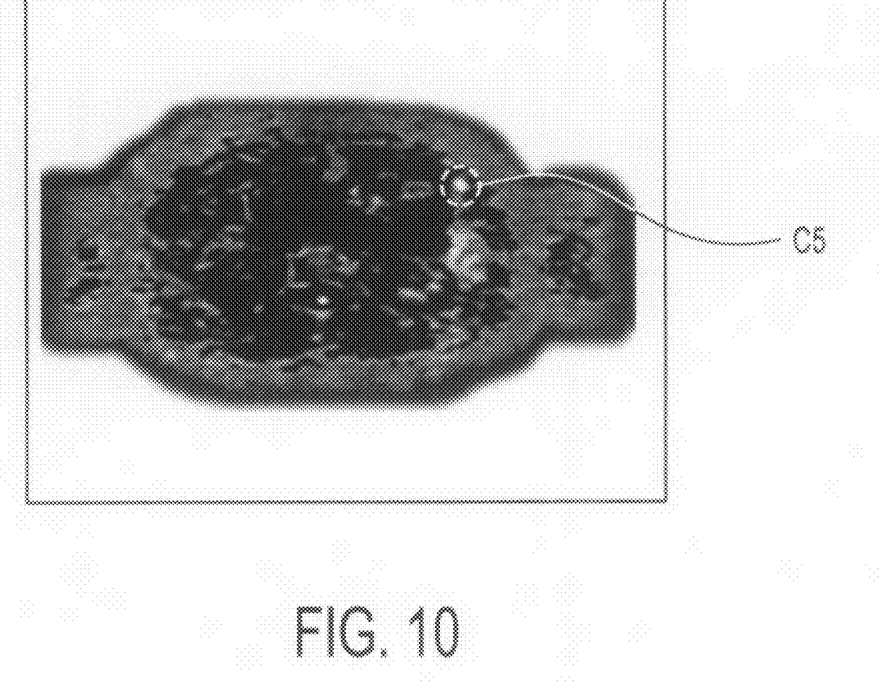
FIG. 10 is a diagram showing an example of the MIP image.

As to the images to be read and MIP images, pixels in a region where the ADC value is equal to or higher than the ADC value are masked by the pixel value "0", and pixels of the other regions have values of those in the DWI image. Therefore, there is a high possibility that T2 shine-through, in which the ADC value is high, is masked by the pixel value "0", whereas a tumor, where the ADC value is low, remains without being masked. Therefore, a region with a high possibility of having a tumor is displayed highlighted as in the region having a high pixel value present in a circle C4 shown in FIG. 9 in the case of the image to be read, or as in the region having a high pixel value present in a circle C5 shown in FIG. 10 in the case of the MIP image. As described, with the to-be-read images generated in the second embodiment, it is possible to carry out image reading while monitoring the data shown in DWI images and those shown in ADC images at the same time. In this manner, it is possible to assist the operator to be able to read images more accurately and more easily.

Further, according to the second embodiment, the threshold value can be arbitrarily set by the operator, and therefore even if the ADC value varies depending on an individual patient or imaging conditions, etc., the optimal threshold value can be set in accordance with the variation.

Furthermore, in the second embodiment, when the threshold value is changed, to-be-read images and MIP images are automatically generated using the changed threshold value, and thus the displayed to-be-read images and MIP images are updated. In this manner, the operator is able to set an appropriate threshold value while monitoring the images to be read.

The embodiments of the present invention can be modified in various ways, for example, as will now be indicated.

That is, in the first embodiment, it is alternatively possibly to generate in advance a plurality of groups of images to be read using a plurality of threshold values, and display those images related to a threshold value designated by the operator. Further, it is alternatively possible that these groups of to-be-read images are output to an image server or the like, and necessary images are selectively displayed in a viewer.

In the second embodiment, it is alternatively possibly to generate in advance a plurality of groups of images to be read and MIP images using a plurality of threshold values, and display those to-be-selected images and MIP images related to a threshold value designated by the operator. Further, it is alternatively possible that these groups of to-be-read images and MIP images are output to an image server or the like, and necessary images are selectively displayed in a viewer.

Moreover, the present invention can be realized as an image processing apparatus in the first embodiment that generates images to be read from DWI images obtained with an MRI apparatus by carrying out steps Sa2 to Sa11 or steps Sa3 to Sa11 in the first embodiment using a computer provided independent from the MRI apparatus.

Alternatively, the present invention can be realized as an image processing apparatus in the second embodiment that generates images to be read and MIP images from DWI images obtained with an MRI apparatus by carrying out steps Sb2 to Sb11 or steps Sb3 to Sb11 in the second embodiment using a computer provided independent from the MRI apparatus.

In the second embodiment, the generation of the MIP images may be omitted.

The images to be read are not limited to those indicated in the first or second embodiment, but they may be arbitrary kinds of images as long as their DWI images are shown in such a manner that a region with a lower ADC value is indicated with a more prominent highlight.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic resonance imaging apparatus comprising:
   a unit which generates a diffusion weighted image based on a magnetic resonance signal from an object;
   a unit which calculates an apparent diffusion coefficient based on the diffusion weighted image; and
   a processing unit which subjects the diffusion weighted image to a process of indicating a region having the apparent diffusion coefficient of less than a threshold value with a highlight in contrast with at least one other region of the diffusion weighted image.

2. The magnetic resonance imaging apparatus according to claim 1, further comprising:
   a setting unit which sets a value assigned arbitrarily by an operator as the threshold value.

3. The magnetic resonance imaging apparatus according to claim 2, wherein the processing unit, when a new threshold value is set by the setting unit, subjects the diffusion weighted image to the process using the new threshold value.

4. The magnetic resonance imaging apparatus according to claim 1, wherein the processing unit further comprising:
   a low-value region image generating unit which generates a low-value region image that indicates a region where the apparent diffusion coefficient is less than the threshold value in the diffusion weighted image; and
   a superimposing unit which superimposes the low-value region image onto the diffusion weighted image.

5. The magnetic resonance imaging apparatus according to claim 1, wherein the low-value region image generating unit generates the low-value region image in such a way that the region where the apparent diffusion coefficient is less than the threshold value in the diffusion weighted image is tinted with a different color from that of the diffusion weighted image.

6. The magnetic resonance imaging apparatus according to claim 4, wherein:
   the low-value region image generating unit generates the low-value region image after binarizing the diffusion weighted image with the threshold value, and
   the superimposing unit subjects the diffusion weighted image to a masking process based on the low-value region image.

7. The magnetic resonance imaging apparatus according to claim 4, wherein the processing unit carries out a maximum intensity projection process on superimposed images obtained from a plurality of slices of diffusion weighted image and respective low-value region images.

8. The magnetic resonance imaging apparatus according to claim 4, wherein:
   the low-value region image generating unit generates a plurality of low-value region images using a plurality of threshold values, and
   the superimposing unit superimposes each of the plurality of low-value region images to the diffusion weighted image.

9. An image processing apparatus usable with magnetic resonance imaging comprising:
   a first memory unit which stores a diffusion weighted image of an object;
   a second memory unit which stores an apparent diffusion coefficient image related to the diffusion weighted image; and
   a processing unit which subjects the diffusion weighted image to a process of indicating a region having an apparent diffusion coefficient of less than a threshold value with a highlight in contrast with at least one other region of the diffusion weighted image.

10. A magnetic resonance imaging method comprising the steps of:
    generating a diffusion weighted image based on a magnetic resonance signal from an object;
    calculating an apparent diffusion coefficient based on the diffusion weighted image; and
    subjecting the diffusion weighted image to a process of indicating a region having the apparent diffusion coefficient of less than a threshold value with a highlight in contrast with at least one other region of the diffusion weighted image.

* * * * *